US006917459B2

(12) United States Patent
Nikkel et al.

(10) Patent No.: US 6,917,459 B2
(45) Date of Patent: Jul. 12, 2005

(54) MEMS DEVICE AND METHOD OF FORMING MEMS DEVICE

(75) Inventors: Eric L. Nikkel, Philomath, OR (US); Mickey Szepesi, Salem, OR (US); Sadiq Bengali, Corvallis, OR (US); Michael G. Monroe, Corvallis, OR (US); Stephen J Potochnik, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 121 days.

(21) Appl. No.: 10/454,423

(22) Filed: Jun. 3, 2003

(65) Prior Publication Data
US 2004/0245588 A1 Dec. 9, 2004

(51) Int. Cl.$^7$ ................ G02B 26/00; G02B 26/08; B05D 5/06; C23C 14/02; H01L 21/00; H01L 21/44; H01L 21/461
(52) U.S. Cl. ............ 359/290; 359/292; 359/295; 359/224; 427/162; 427/534; 438/24; 438/48; 438/599; 438/691; 438/734
(58) Field of Search ................. 359/290–292, 359/295, 298, 214, 224, 230; 257/415, 678, 723; 216/2, 11, 13, 24, 88; 438/7, 17, 22, 24, 28, 48, 53, 599, 691, 734; 427/162, 534, 255.6

(56) References Cited

U.S. PATENT DOCUMENTS

| 5,620,931 A | 4/1997 | Tsang et al. |
| 5,919,548 A | 7/1999 | Barron et al. |
| 6,121,552 A | 9/2000 | Brosnihan et al. |
| 6,396,368 B1 | 5/2002 | Chow et al. |
| 6,440,766 B1 | 8/2002 | Clark |
| 6,469,330 B1 | 10/2002 | Vigna et al. |
| 6,480,320 B2 | 11/2002 | Nasiri |
| 6,523,961 B2 | 2/2003 | Ilkov et al. |
| 2002/0039470 A1 | 4/2002 | Braun et al. |
| 2002/0109903 A1 | 8/2002 | Kaeriyama |
| 2003/0034535 A1 | 2/2003 | Barenburg et al. |

FOREIGN PATENT DOCUMENTS

| DE | 10017422 | 10/2001 |
| EP | 1093143 A1 | 4/2001 |
| JP | 2000314634 | 7/2001 |

OTHER PUBLICATIONS

Kyu–Ho Hwang et al, "Thin–Film Micromirror Array for High–Brightness Projection Displays", J. Appl. Phys, v. 37 (1998), pp 7074–7077.

J.H. Smith et al., "Material and Processing Issues for the Monolithic Integration of Microelectronics with Surface–Micromachined Polysilicon Sensors and Actuators" SPIE, Oct. 1995, pp. 1–10.

Oliver Brand, "CMOS–based MEMS/DTU PhD Course/Topics in Microelectronics", Physical Electronics Laboratory, ETH Zurich, http://www.iqe.ethz.ch/pel, slides A–2 through A–36.

(Continued)

*Primary Examiner*—Georgia Epps
*Assistant Examiner*—Jack Dinh (57) ABSTRACT

A method of forming a MEMS device includes providing a substructure including a base material and at least one conductive layer formed on a first side of the base material, forming a dielectric layer over the at least one conductive layer of the substructure, forming a protective layer over the dielectric layer, defining an electrical contact area for the MEMS device on the protective layer, and forming an opening within the electrical contact area through the protective layer and the dielectric layer to the at least one conductive layer of the substructure.

56 Claims, 9 Drawing Sheets

OTHER PUBLICATIONS

J.H. Smith et al., "Embedded Micromechanical Devices for the Monolithic Integration of MEMS with CMOS", 1995 IEEE, pp. 609–612.

Bikram Baidaya et al., "Layout Verification and Correction of CMOS–MEMS Layouts", Carnegle Mellon University, Pittsburgh.

Jeffrey D. Zahn et al., A Direct Plasma Etch Approach to High Aspect Ratio Polymer Micromachining With Applications in Biomems and CMOS–MEMS, 2002 IEEE, pp. 137–140.

Jim Hunter et al., "CMOS friendly MEMS manufacturing process", 1998 IEEE, pp. 103–104.

MEMS DEVICE AND METHOD OF FORMING MEMS DEVICE

THE FIELD OF THE INVENTION

The present invention relates generally to microactuators, and more particularly to a micro-mirror device.

BACKGROUND OF THE INVENTION

Microelectromechanical systems or MEMS devices include micromachined substrates integrated with electronic microcircuits. Such devices may form, for example, microsensors or microactuators which operate based on, for example, electromagnetic, electrostrictive, thermoelectric, piezoelectric, or piezoresistive effects. MEMS devices have been formed on insulators or other substrates using microelectronic techniques such as photolithography, vapor deposition, and etching.

An example of a MEMS device includes a micro-mirror device. The micro-mirror device can be operated as a light modulator for amplitude and/or phase modulation of incident light. One application of a micro-mirror device is in a display system. As such, multiple micro-mirror devices are arranged in an array such that each micro-mirror device provides one cell or pixel of the display. A conventional micro-mirror device includes an electrostatically actuated mirror supported for rotation about an axis of the mirror. As such, rotation of the mirror about the axis may be used to modulate incident light by directing the incident light in different directions. In order to operate the micro-mirror device, the micro-mirror device utilizes drive circuitry.

Accordingly, it is desired to effectively integrate drive circuitry for a micro-mirror device with the micro-mirror device.

SUMMARY OF THE INVENTION

One aspect of the present invention provides a method of forming a MEMS device. The method includes providing a substructure including a base material and at least one conductive layer formed on a first side of the base material, forming a dielectric layer over the at least one conductive layer of the substructure, forming a protective layer over the dielectric layer, defining an electrical contact area for the MEMS device on the protective layer, and forming an opening within the electrical contact area through the protective layer and the dielectric layer to the at least one conductive layer of the substructure.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
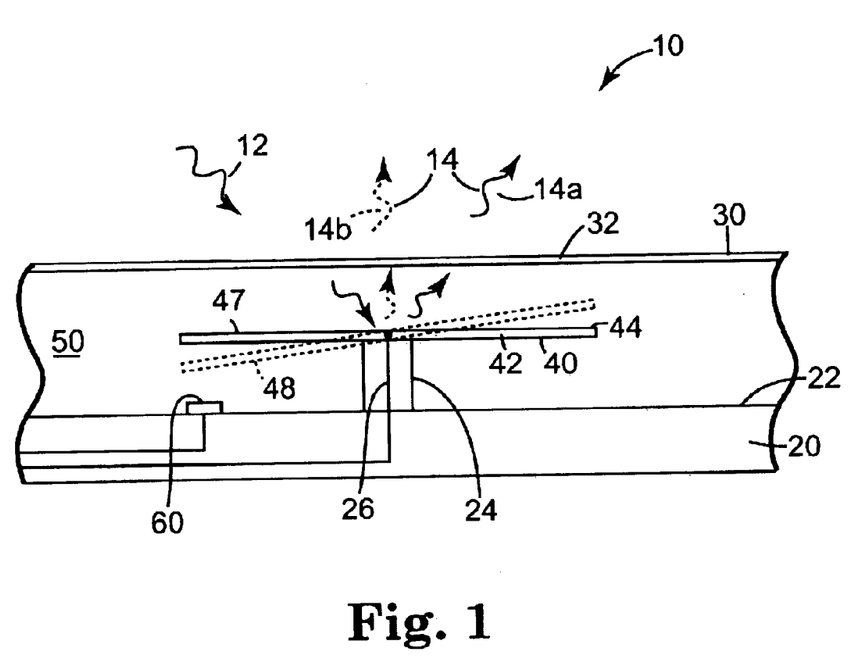
FIG. 1 is a schematic cross-sectional view illustrating one embodiment of a portion of a micro-mirror device.

FIG. 1 illustrates one embodiment of a micro-mirror device 10. Micro-mirror device 10 is a micro-actuator which relies on electrical to mechanical conversion to generate a force and cause movement or actuation of a body or element. In one embodiment, as described below, a plurality of micro-mirror devices 10 are arranged to form an array of micro-mirror devices. As such, the array of micro-mirror devices may be used to form a display. As such, each micro-mirror device 10 constitutes a light modulator for modulation of incident light and provides one cell or pixel of the display. In addition, micro-mirror device 10 may also be used in other imaging systems such as projectors and may also be used for optical addressing.

In one embodiment, micro-mirror device 10 includes a substrate 20, a plate 30, and an actuating element 40. Preferably, plate 30 is oriented substantially parallel to a surface 22 of substrate 20 and spaced from surface 22 so as to define a cavity 50 therebetween. Actuating element 40 is interposed between surface 22 of substrate 20 and plate 30. As such, actuating element 40 is positioned within cavity 50. In one embodiment, actuating element 40 is supported relative to substrate 20 by a support or post 24 extending from surface 22 of substrate 20.

In one embodiment, actuating element 40 is actuated so as to move between a first position 47 and a second position 48 relative to substrate 20 and plate 30. Preferably, actuating element 40 moves or tilts at an angle about an axis of rotation. As such, first position 47 of actuating element 40 is illustrated as being substantially horizontal and substantially parallel to substrate 20 and second position 48 of actuating element 40 is illustrated as being oriented at an angle to first position 47. Movement or actuation of actuating element 40 relative to substrate 20 and plate 30 is described in detail below.

Preferably, plate 30 is a transparent plate 32 and actuating element 40 is a reflective element 42. In one embodiment, transparent plate 32 is a glass plate. Other suitable planar translucent or transparent materials, however, may be used. Examples of such a material include quartz and plastic.

Reflective element 42 includes a reflective surface 44. In one embodiment, reflective element 42 is formed of a uniform material having a suitable reflectivity to form reflective surface 44. Examples of such a material include polysilicon or a metal such as aluminum. In another embodiment, reflective element 42 is formed of a base material such as polysilicon with a reflective material such as aluminum or titanium nitride disposed on the base material to form reflective surface 44. In addition, reflective element 42 may be formed of a non-conductive material or may be formed of or include a conductive material.

As illustrated in the embodiment of FIG. 1, micro-mirror device 10 modulates light generated by a light source (not shown) located on a side of transparent plate 32 opposite of substrate 20. The light source may include, for example, ambient and/or artificial light. As such, input light 12, incident on transparent plate 32, passes through transparent plate 32 into cavity 50 and is reflected by reflective surface 44 of reflective element 42 as output light 14. Thus, output light 14 passes out of cavity 50 and back through transparent plate 32.

The direction of output light 14 is determined or controlled by the position of reflective element 42. For example, with reflective element 42 in first position 47, output light 14 is directed in a first direction 14a. However, with reflective element 42 in second position 48, output light 14 is directed in a second direction 14b. Thus, micro-mirror device 10 modulates or varies the direction of output light 14 generated by input light 12. As such, reflective element 42 can be used to steer light into, and/or away from, an optical imaging system.

In one embodiment, first position 47 is a neutral position of reflective element 42 and represents an "ON" state of micro-mirror device 10 in that light is reflected, for example, to a viewer or onto a display screen, as described below. Thus, second position 48 is an actuated position of reflective element 42 and represents an "OFF" state of micro-mirror device 10 in that light is not reflected, for example, to a viewer or onto a display screen.

In one embodiment, reflective element 42 is moved between first position 47 and second position 48 by applying an electrical signal to an electrode 60 formed on substrate 20. In one embodiment, electrode 60 is formed on surface 22 of substrate 20 adjacent an end or edge of reflective element 42. Application of an electrical signal to electrode 60 generates an electric field between electrode 60 and reflective element 42 which causes movement of reflective element 42 between first position 47 and second position 48. Preferably, when the electrical signal is removed from electrode 60, reflective element 42 persists or holds second position 48 for some length of time. Thereafter, restoring forces of reflective element 42 pull or return reflective element 42 to first position 47.

In one embodiment, a conductive via 26 is formed in and extends through post 24. Conductive via 26 is electrically coupled to reflective element 42 and, more specifically, conductive material of reflective element 42. As such, reflective element 42 is moved between first position 47 and second position 48 by applying an electrical signal to electrode 60 and reflective element 42. More specifically, electrode 60 is energized to one polarity and the conductive material of reflective element 42 is energized to an opposite polarity. Thus, application of an electrical signal of one polarity to electrode 60 and an electrical signal of an opposite polarity to reflective element 42 generates an electric field between electrode 60 and reflective element 42 which causes movement of reflective element 42 between first position 47 and second position 48.

In another embodiment, reflective element 42 is moved between first position 47 and second position 48 by applying an electrical signal to reflective element 42. More specifically, the electrical signal is applied to conductive material of reflective element 42 by way of conductive via 26 through post 24. As such, application of an electrical signal to reflective element 42 generates an electric field which causes movement of reflective element 42 between first position 47 and second position 48.

Additional embodiments of actuation of micro-mirror device 10 are described, for example, in U.S. patent application Ser. No. 10/136,719, filed on Apr. 30, 2002, entitled "Micro-Mirror Device", assigned to the assignee of the present invention and incorporated herein by reference.

Figure 2:
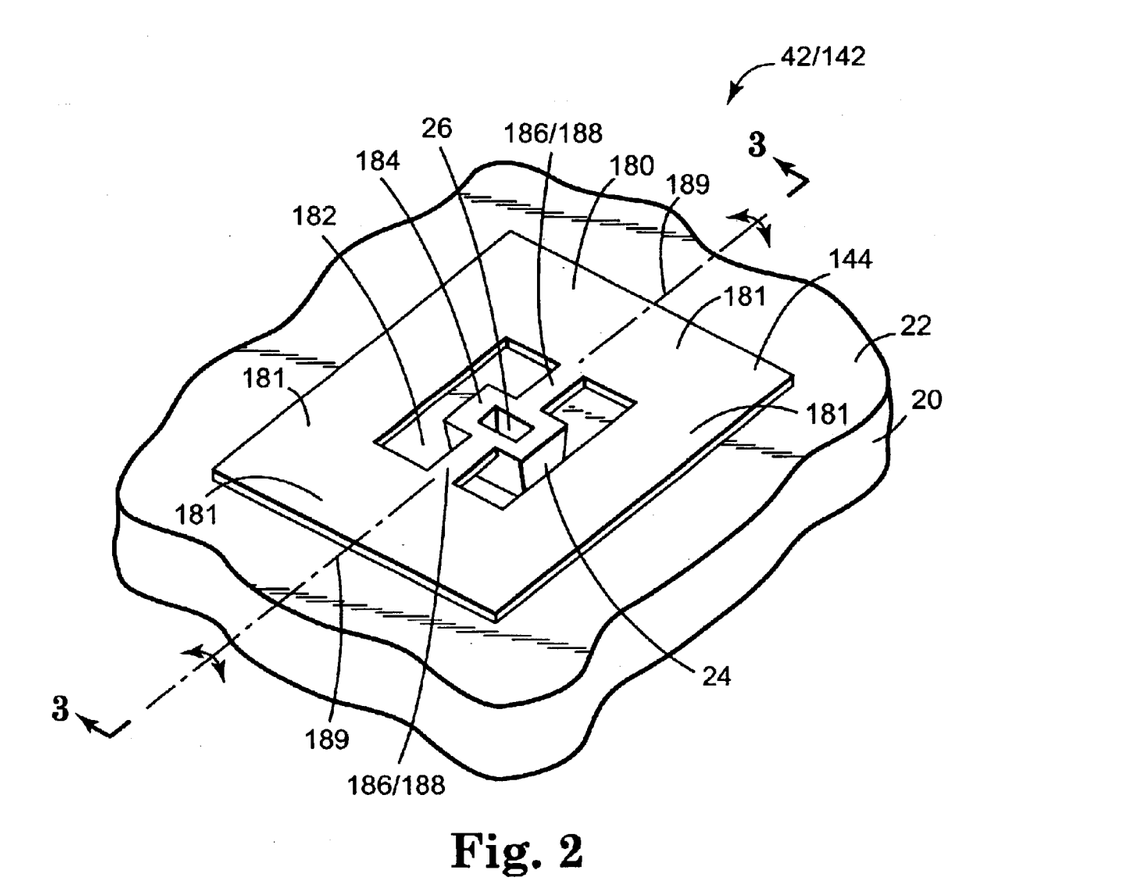
FIG. 2 is a perspective view illustrating one embodiment of a portion of a micro-mirror device.

FIG. 2 illustrates one embodiment of reflective element 42. Reflective element 142 has a reflective surface 144 and includes a substantially rectangular-shaped outer portion 180 and a substantially rectangular-shaped inner portion 184. In one embodiment, reflective surface 144 is formed on both outer portion 180 and inner portion 184. Outer portion 180 has four contiguous side portions 181 arranged to form a substantially rectangular-shaped opening 182. As such, inner portion 184 is positioned within opening 182. Preferably, inner portion 184 is positioned symmetrically within opening 182.

In one embodiment, a pair of hinges 186 extend between inner portion 184 and outer portion 180. Hinges 186 extend from opposite sides or edges of inner portion 184 to adjacent opposite sides or edges of outer portion 180. Preferably, outer portion 180 is supported by hinges 186 along an axis of symmetry. More specifically, outer portion 180 is supported about an axis that extends through the middle of opposed edges thereof. As such, hinges 186 facilitate movement of reflective element 142 between first position 47 and second position 48, as described above (FIG. 1). More specifically, hinges 186 facilitate movement of outer portion 180 between first position 47 and second position 48 relative to inner portion 184.

In one embodiment, hinges 186 include torsional members 188 having longitudinal axes 189 oriented substantially parallel to reflective surface 144. Longitudinal axes 189 are collinear and coincide with an axis of symmetry of reflective element 142. As such, torsional members 188 twist or turn about longitudinal axes 189 to accommodate movement of outer portion 180 between first position 47 and second position 48 relative to inner portion 184.

In one embodiment, reflective element 142 is supported relative to substrate 20 by support or post 24 extending from surface 22 of substrate 20. More specifically, post 24 supports inner portion 184 of reflective element 142, and outer portion 180 of reflective element 142 is supported by hinges 186 extending from inner portion 184. In one embodiment, post 24 is formed by conductive via 26 extending through inner portion 184 to a conductive layer of substrate 20.

Figure 3A:
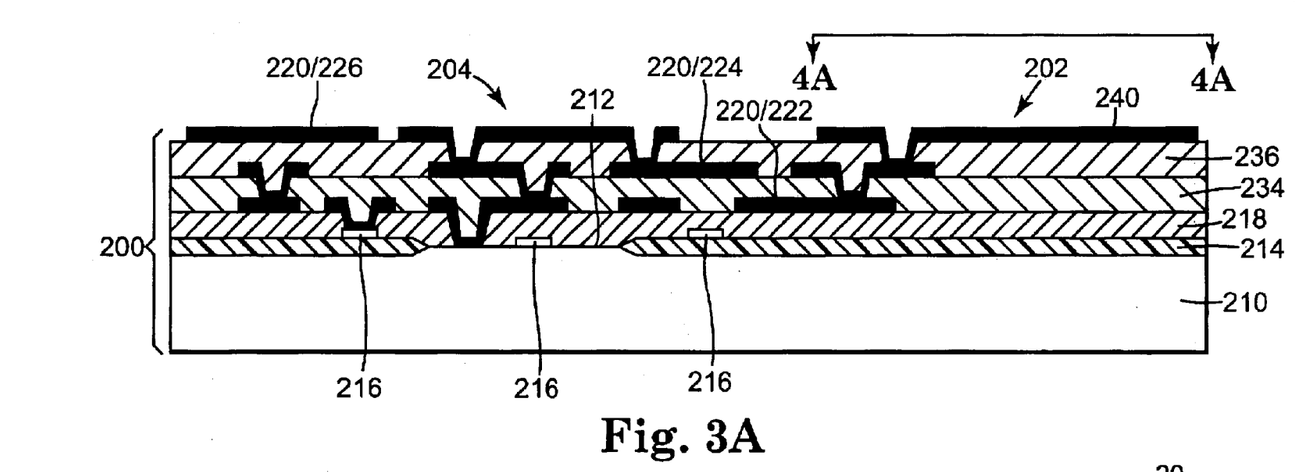
FIGS. 3A–3H illustrate one embodiment of forming a micro-mirror device according to the present invention.

FIGS. 3A–3H illustrate one embodiment of forming micro-mirror device 10. In one embodiment, as illustrated in FIG. 3A, micro-mirror device 10 is formed on a substructure 200. In one embodiment, substructure 200 includes a complementary metal oxide semi-conductor (CMOS) structure. In one exemplary embodiment, the CMOS structure includes a three-level metal (3LM) CMOS circuit. As such, substructure 200 includes a base material 210 and a plurality of conductive layers 220 formed on a first side 212 of base material 210. More specifically, substructure 200 includes a first conductive layer 222, a second conductive layer 224, and a third conductive layer 226 formed on first side 212 of base material 210. In one embodiment, conductive layers 222, 224, and 226 include, for example, titanium (Ti), titanium nitride (TiN), copper (Cu), gold (Au), and/or aluminum (Al).

In one embodiment, substructure 200 includes an oxide layer 214 and one of more gates 216. Oxide layer 214 is formed over first side 212 of base material 210. In addition, gates 216 are formed on first side 212 of base material 210. In one embodiment, base material 210 of substructure 200 is formed of silicon and oxide layer 214 includes, for example, field oxide (FOX). In addition, gates 216 are formed of polysilicon.

In one embodiment, substructure 200 includes a dielectric layer 218. Dielectric layer 218 is formed over oxide layer 214 and first side 212 of base material 210. As such, conductive layer 222 of substructure 200 is formed over dielectric layer 218. In addition, conductive layers 224 and 226 of substructure 200 are formed over respective dielectric layers 234 and 236 of substructure 200. In one embodiment, dielectric layer 218 includes, for example, borophosphosilicate (BPTEOS) and dielectric layers 234 and 236 include, for example, tetraethylorthosilicate (TEOS). Conductive layers 222, 224, and 226 are formed, for example, by deposition, and patterned by photolithography and etching.

In one embodiment, conductive layer 222 communicates with one or more gates 216 by conductive vias formed through dielectric layer 218. In addition, conductive layers 222, 224, and 226 communicate with each other by conductive vias formed through dielectric layers 234 and 236. In one embodiment, conductive material of conductive layer 226 forms an electrical contact area 202 of substructure 200 and an array or actuating area 204 of substructure 200. Electrical contact area 202 defines an area where electrical connection to the CMOS circuit of micro-mirror device 10 is to be made and actuating area 204 defines an area where actuating element 40 of micro-mirror device 10 is to be formed, as described below. It is understood that FIG. 3A is a schematic representation of substructure 200 and that an actual configuration of conductive layers 220 and conductive vias formed between conductive layers 220 may be more complicated than that illustrated.

Figure 4A:
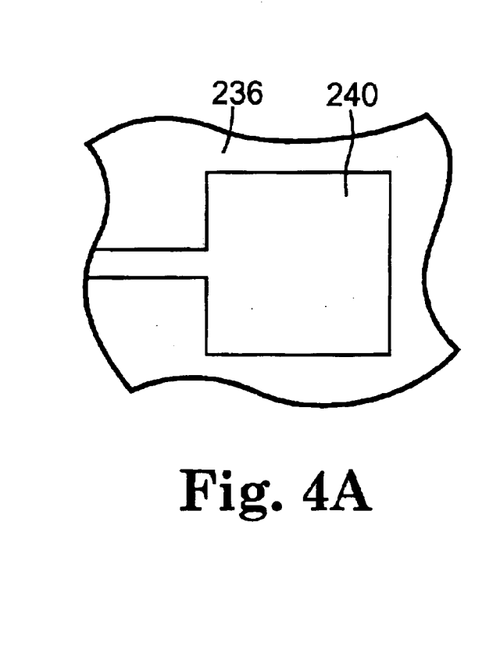
FIGS. 4A, 4C, and 4E illustrate one embodiment of an electrical contact area of FIGS. 3A, 3C, and 3E, respectively, while forming a micro-mirror device according to the present invention.

In one embodiment, as illustrated in FIGS. 3A and 4A, conductive material of conductive layer 226 is patterned to form an electrical contact pad 240 for micro-mirror device 10. Electrical contact pad 240 is formed, for example, in electrical contact area 202 of substructure 200. As such, electrical contact pad 240 provides a point for electrical connection to the CMOS circuit of micro-mirror device 10.

Figure 3B:
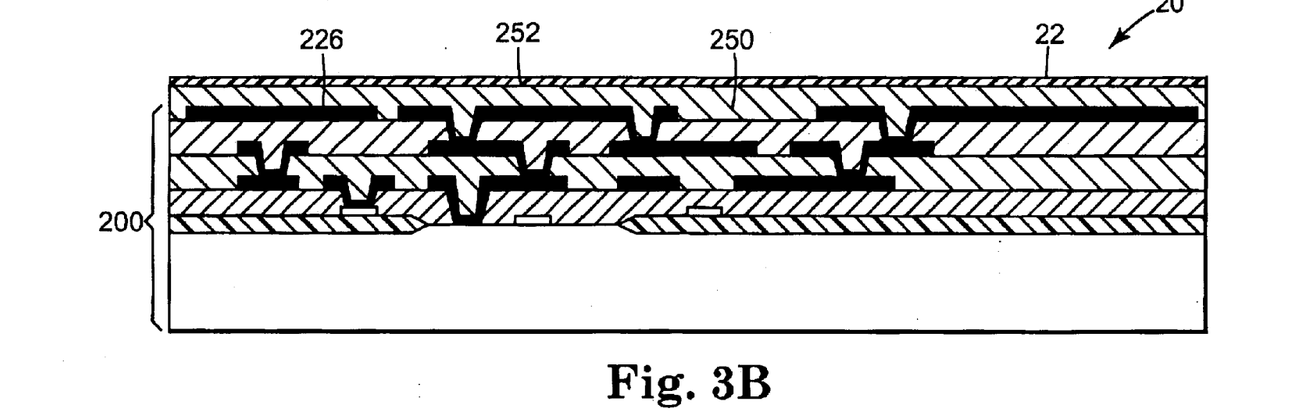

As illustrated in the embodiment of FIG. 3B, to form micro-mirror device 10 on substructure 200, a dielectric layer 250 is formed over conductive layer 226 of substructure 200. In addition, a protective layer 252 is formed over dielectric layer 250. In one embodiment, dielectric layer 250 is formed by depositing a dielectric material over conductive layer 226. The dielectric material of dielectric layer 250 is deposited, for example, by chemical vapor deposition (CVD) or plasma enhanced CVD (PECVD). In one embodiment, dielectric layer 250 includes, for example, TEOS and protective layer 252 is formed of a material which is resistant to etchant used for subsequent processing in forming micro-mirror device 10, as described below.

After the dielectric material of dielectric layer 250 is deposited over conductive layer 226, the dielectric material is planarized to create a substantially flat surface of dielectric layer 250. In one embodiment, the dielectric material is planarized by a chemical mechanical polishing (CMP) process. Preferably, after dielectric layer 250 is planarized, protective layer 252 is formed.

In one embodiment, protective layer 252 is formed by depositing a dielectric material over dielectric layer 250. The dielectric material of protective layer 252 is deposited, for example, by CVD or PECVD. In one embodiment, protective layer 252 includes, for example, silicon carbide (SiC). In one embodiment, substructure 200, dielectric layer 250, and protective layer 252 form substrate 20 of micro-mirror device 10. As such, protective layer 252 forms surface 22 of substrate 20 (FIG. 1).

Figure 3C:
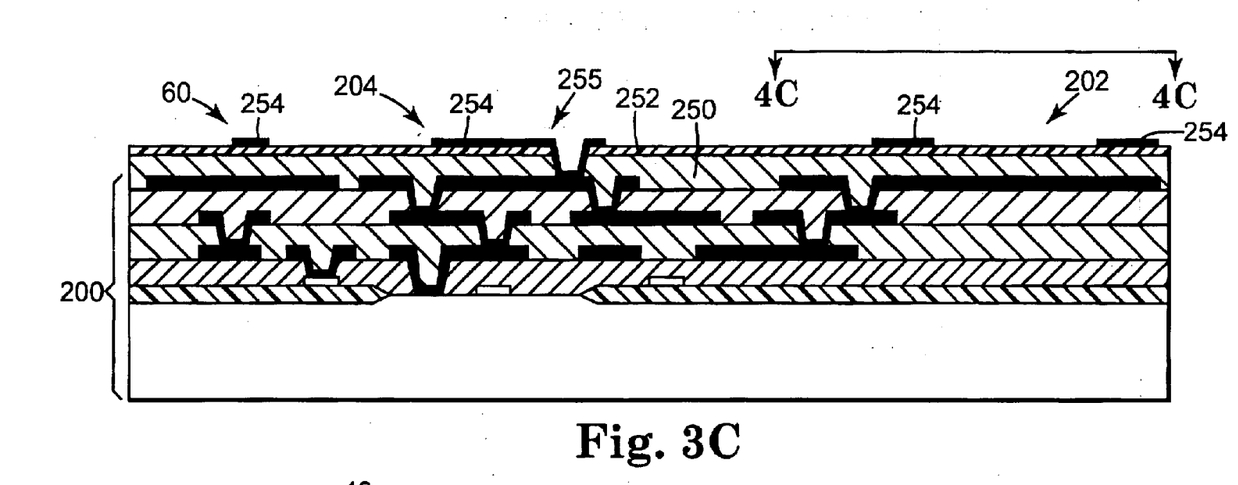

Next, as illustrated in the embodiment of FIG. 3C, array or actuating area 204 of substructure 200 and electrical contact area 202 of substructure 200 are defined on protective layer 252. In one embodiment, actuating area 204 and electrical contact area 202 are formed by depositing a conductive material 254 on protective layer 252, and patterning and etching conductive material 254 to define actuating area 204 and electrical contact area 202 on protective layer 252. In one embodiment, conductive material 254 includes a material which is resistant to etchant used for subsequent processing in forming micro-mirror device 10, as described below. In one embodiment, conductive material 254 includes, for example, titanium nitride (TiN).

In one embodiment, conductive material 254 of actuating area 204 is patterned to define a conductive path 255 on protective layer 252. In one embodiment, conductive path 255 communicates with conductive layer 226 of substructure 200 by a conductive via formed through protective layer 252 and dielectric layer 250. In addition, in one embodiment, conductive material 254 is patterned to define electrode 60 on protective layer 252 and, more specifically, surface 22 of substrate 20, as described above.

Figure 3F:
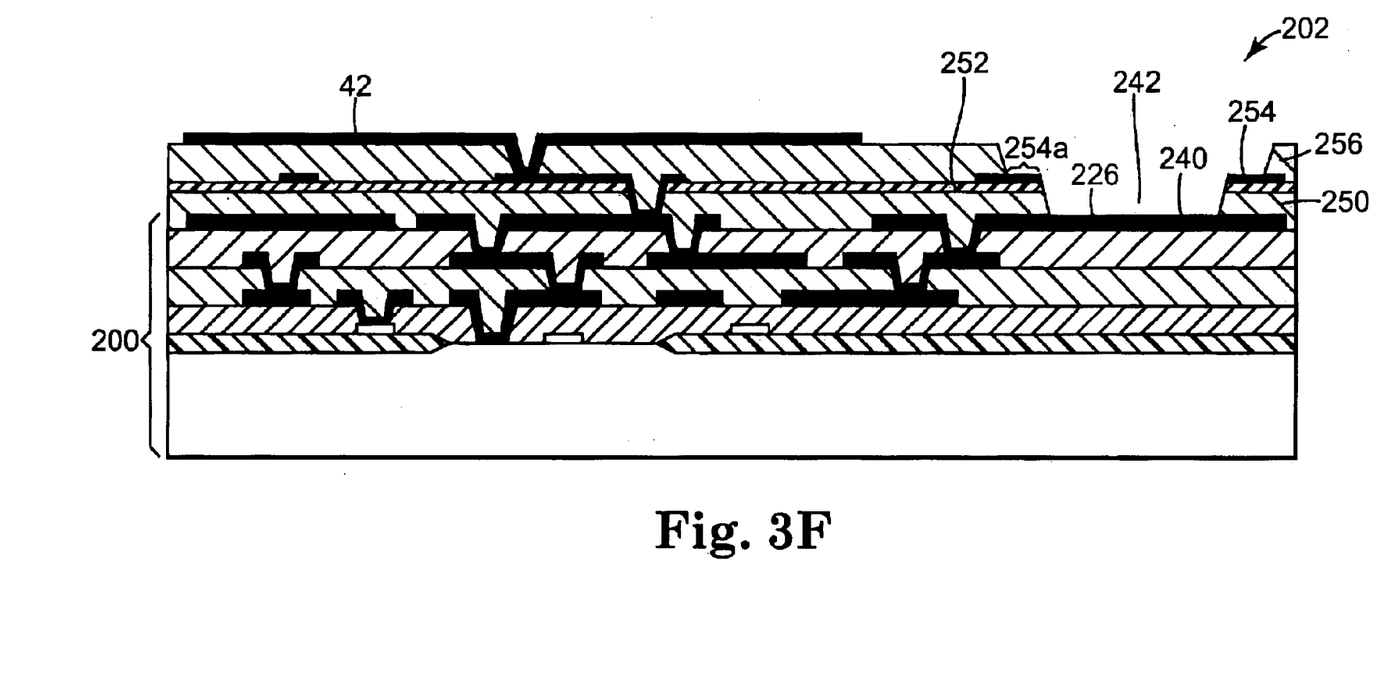
Figure 4C:
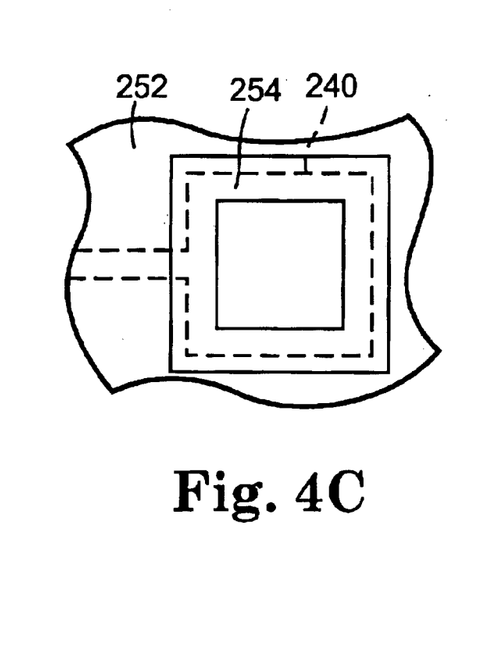

In one embodiment, as illustrated in FIGS. 3C and 4C, conductive material 254 of electrical contact area 202 is patterned to outline or define a boundary of electrical contact area 202 of substructure 200 on protective layer 252. More specifically, conductive material 254 is patterned to outline where an opening 242 (FIG. 3F) of electrical contact area 202 is to be formed. Opening 242 is formed to conductive layer 226 of substructure 200 and, more specifically, electrical contact pad 240, as described below.

Figure 3D:
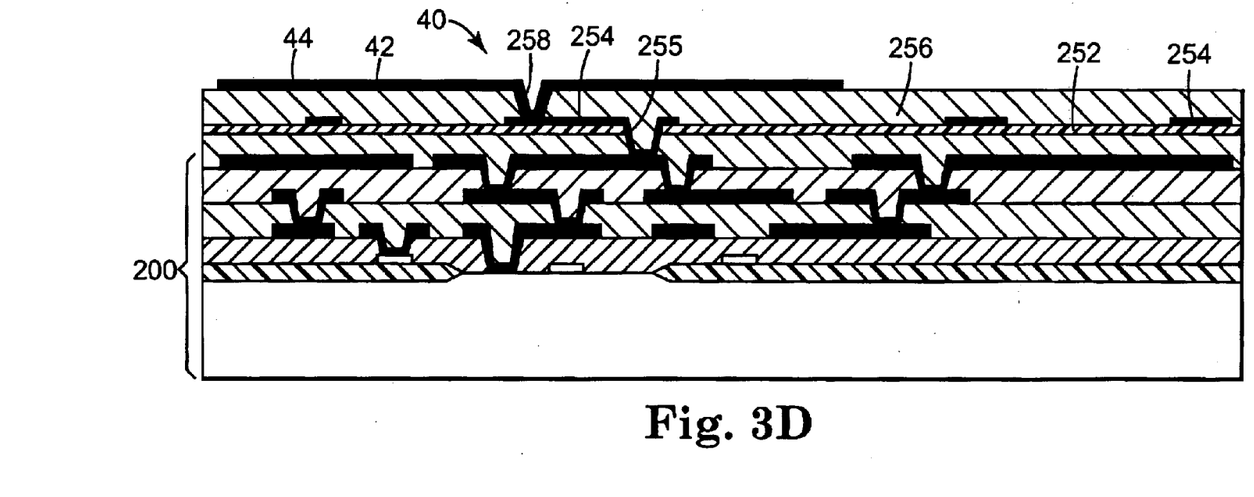

As illustrated in the embodiment of FIG. 3D, after actuating area 204 and electrical contact area 202 of substructure 200 are defined on protective layer 252, a sacrificial layer 256 is formed. Sacrificial layer 256 is formed, for example, by depositing a material over conductive material 254 and protective layer 252. Sacrificial layer 256 is sacrificial in that the material of sacrificial layer 256 is substantially removed during subsequent processing in forming micro-mirror device 10, as described below.

In one embodiment, the material of sacrificial layer 256 includes a dielectric material. The dielectric material of sacrificial layer 256 is deposited, for example, by CVD or PECVD and includes, for example, TEOS. The dielectric material of sacrificial layer 256 may also include, for example, a phosphorous or boron doped oxide.

After the material of sacrificial layer 256 is deposited over conductive material 254 and protective layer 252, the material is planarized to create a substantially flat surface of sacrificial layer 256. In one embodiment, the material is planarized by a CMP process. After sacrificial layer 256 is planarized, actuating element 40 is formed.

In one embodiment, actuating element 40 includes reflective element 42 of micro-mirror device 10. As such, reflective element 40 is formed by depositing one or more layers of one or more materials over sacrificial layer 256, and patterning the materials to define reflective element 42. The materials are deposited, for example, by CVD or PECVD, and patterned by photolithography and etching. In one embodiment, reflective element 42 includes silicon (Si) and reflective surface 44 of reflective element 42 is formed by silver (Ag), chromium (Cr), or another suitable reflective material.

In one embodiment, reflective element 42 communicates with conductive material 254 of actuating area 204 and, more specifically, conductive path 255 of conductive material 254. Reflective element 42 communicates with conductive material 254 by a conductive via 258 formed through sacrificial layer 256. In one embodiment, conductive via 258 forms post 24 and conductive via 26 of micro-mirror device 10, as illustrated in FIG. 1 and described above. In addition, as described above, micro-mirror device 10 represents one example of a MEMS device and reflective element 42 represents an actuating element of the MEMS device.

Figure 3E:
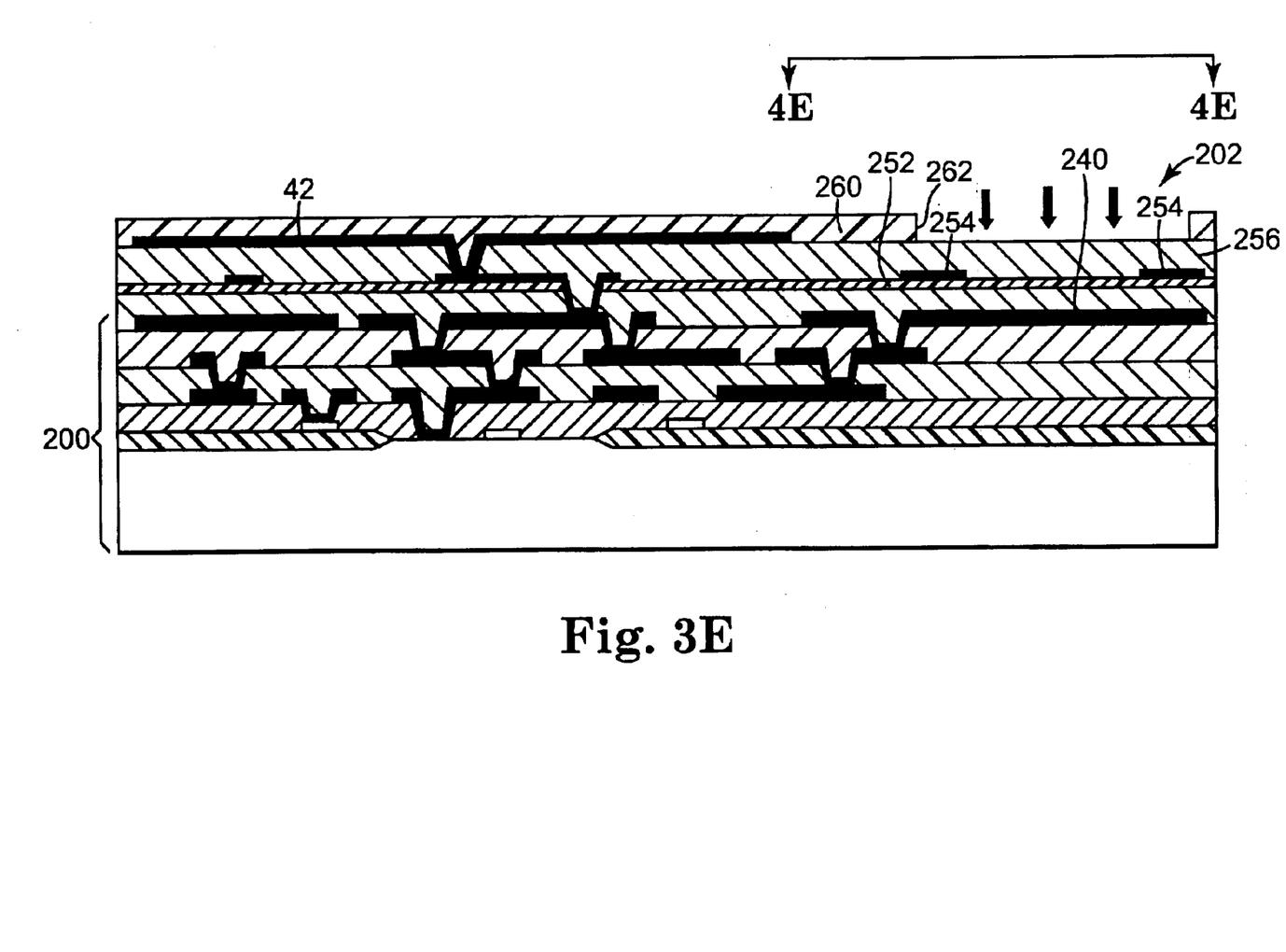

Next, as illustrated in the embodiment of FIG. 3E, a mask layer 260 is formed over reflective element 42 and sacrificial layer 256. In one embodiment, mask layer 260 is formed by deposition and patterned by photolithography to expose an area of sacrificial layer 256. As such, mask layer 260 defines where electrical contact area 202 of substructure 200 is to be etched to form opening 242 (FIG. 3F) to electrical contact pad 240.

Preferably, opening 242 of electrical contact area 202 is formed by chemical etching. Thus, mask layer 260 is formed of a material which is resistant to etchant used for etching opening 242. Examples of a material suitable for mask layer 260 include silicon dioxide, silicon nitride, or photoresist. In one embodiment, the etch process is a dry etch, such as a plasma based fluorinated etch using, for example, $SF_6$, $CF_4$, or $C_2F_6$.

Figure 4E:
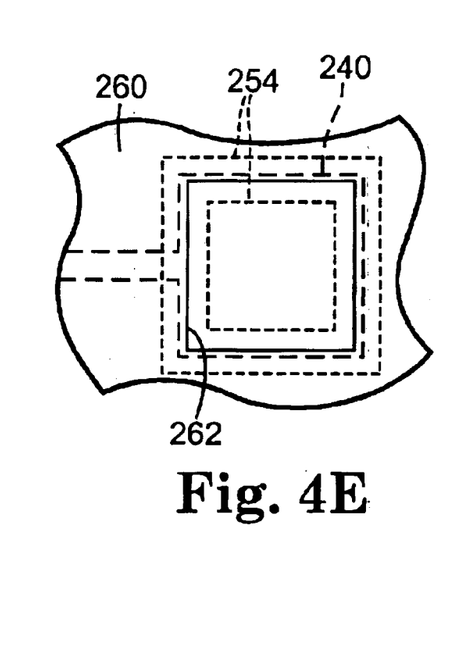

In one embodiment, as illustrated in FIGS. 3E and 4E, mask layer 260 includes a mask opening 262 through which opening 242 (FIG. 3F) of electrical contact area 202 is etched. Preferably, mask opening 262 is smaller than an outer boundary and larger than an inner boundary of conductive material 254 provided in electrical contact area 202 of substructure 200 and on protective layer 252. Thus, etching of opening 242 to electrical contact pad 240 is controlled by conductive material 254, as described below.

As illustrated in the embodiment of FIG. 3F, opening 242 is formed through sacrificial layer 256, through protective layer 252 within the boundary defined by conductive material 254, and through dielectric layer 250 to conductive layer 226 of substructure 200. Electrical contact pad 240 of micro-mirror device 10, therefore, is exposed.

As described above, opening 242 is formed by chemical etching. During etching of opening 242, conductive material 254 provided in electrical contact area 202 acts as an etch stop. More specifically, conductive material 254 masks a portion of protective layer 252 and selectively controls or blocks etching of protective layer 252 and dielectric layer 250. As such, conductive material 254 of electrical contact area 202 limits etching to within an area coinciding with electrical contact pad 240. Since mask opening 262 is smaller than an outer boundary and larger than an inner boundary of conductive material 254 provided in electrical contact area 202, as described above, a portion 254a of conductive material 254 is exposed. As such, this exposed portion 254a of conductive material 254 defines a perimeter of opening 242.

After opening 242 is formed, mask layer 260 is stripped or removed. As such, reflective element 42 and sacrificial layer 256 are revealed or exposed. In one embodiment, when mask layer 260 is formed of an oxide, mask layer 260 is removed, for example, by a chemical etch. In another embodiment, when mask layer 260 is formed of photoresist, mask layer 260 is removed, for example, by a resist stripper.

Figure 3G:
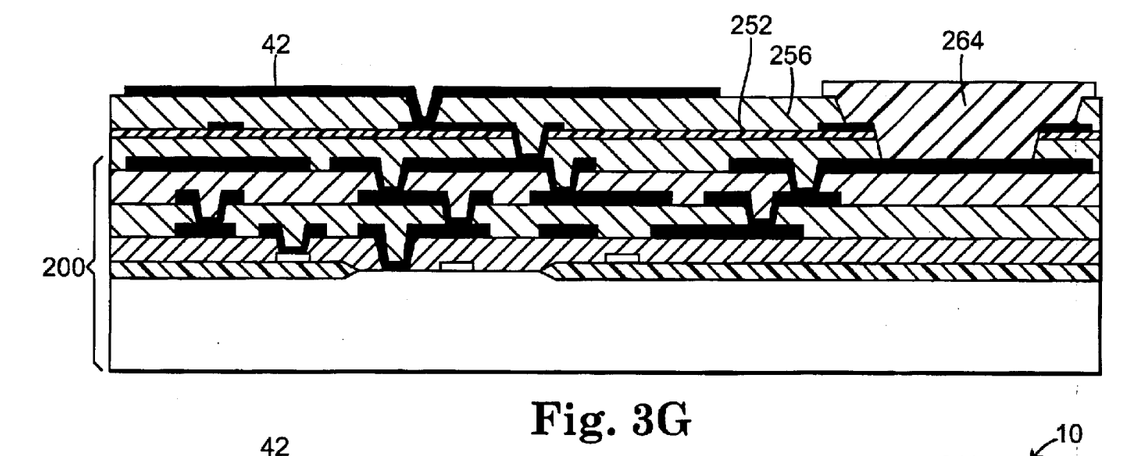

Next, as illustrated in the embodiment of FIG. 3G, opening 242 of electrical contact area 202 is temporarily filled or plugged. Opening 242 is temporarily filled to protect electrical contact pad 240, as exposed through opening 242, during subsequent processing while forming micro-mirror device 10. In one embodiment, opening 242 is temporarily filled with a protective material 264 which is resistant to etchant used for subsequent processing in forming micro-mirror device 10, as described below. In one embodiment, protective material 264 includes, for example, photoresist.

Figure 3H:
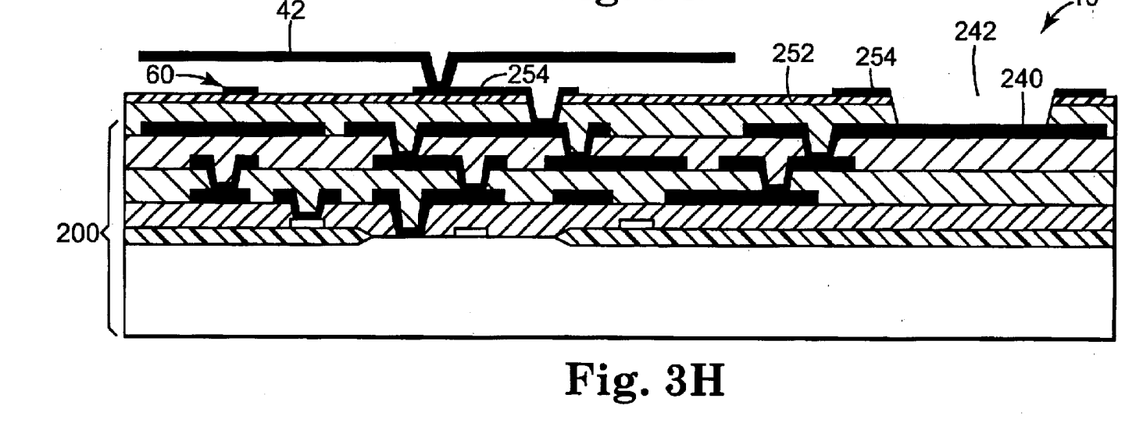

As illustrated in the embodiment of FIG. 3H, sacrificial layer 256 is substantially removed. As such, the material of sacrificial layer 256 is removed from between reflective element 42 and protective layer 252. Thus, reflective element 42 is released and conductive material 254, including electrode 60, is exposed.

Preferably, sacrificial layer 256 is removed by a chemical etch process. As such, protective layer 252, conductive material 254, and protective material 264 are each selected so as to be resistant to the particular etchant used for removing sacrificial layer 256. In one embodiment, the etch process for removing sacrificial layer 256 is a wet etch, such as a buffered oxide etch (BOE).

In one embodiment, with exposed portion 254a of conductive material 254 defining a perimeter of opening 242, as described above with reference to FIG. 3F, additional margin against etchant penetration into opening 242 and to electrical contact pad 240 is realized. More specifically, protective material 264 and exposed portion 254a of conductive material 254 form a lateral interface around the perimeter of opening 242 which is resistant to the particular etchant used for removing sacrificial layer 256. A length of this interface can be sized to provide sufficient margin against etchant penetration into opening 242 depending on a rate of interface failure during etching.

After sacrificial layer 256 is substantially removed, protective material 264 used to fill or plug opening 242 is removed. As such, electrical contact pad 240 of micro-mirror device 10 is exposed. In one embodiment, when protective material 264 includes photoresist, protective material 264 is removed, for example, by a resist stripper or solvent such as isopropyl alcohol or acetone.

While the above description refers to the formation of a micro-mirror device, it is understand that the above process is also applicable to the formation of other MEMS devices, including multi-layer MEMS devices. In addition, it is understood that FIGS. 3A–3H are schematic illustrations of one embodiment of forming a micro-mirror device according to the present invention and that the actual configuration of layers and vias of the micro-mirror device may be more complicated than that illustrated.

Figure 5:
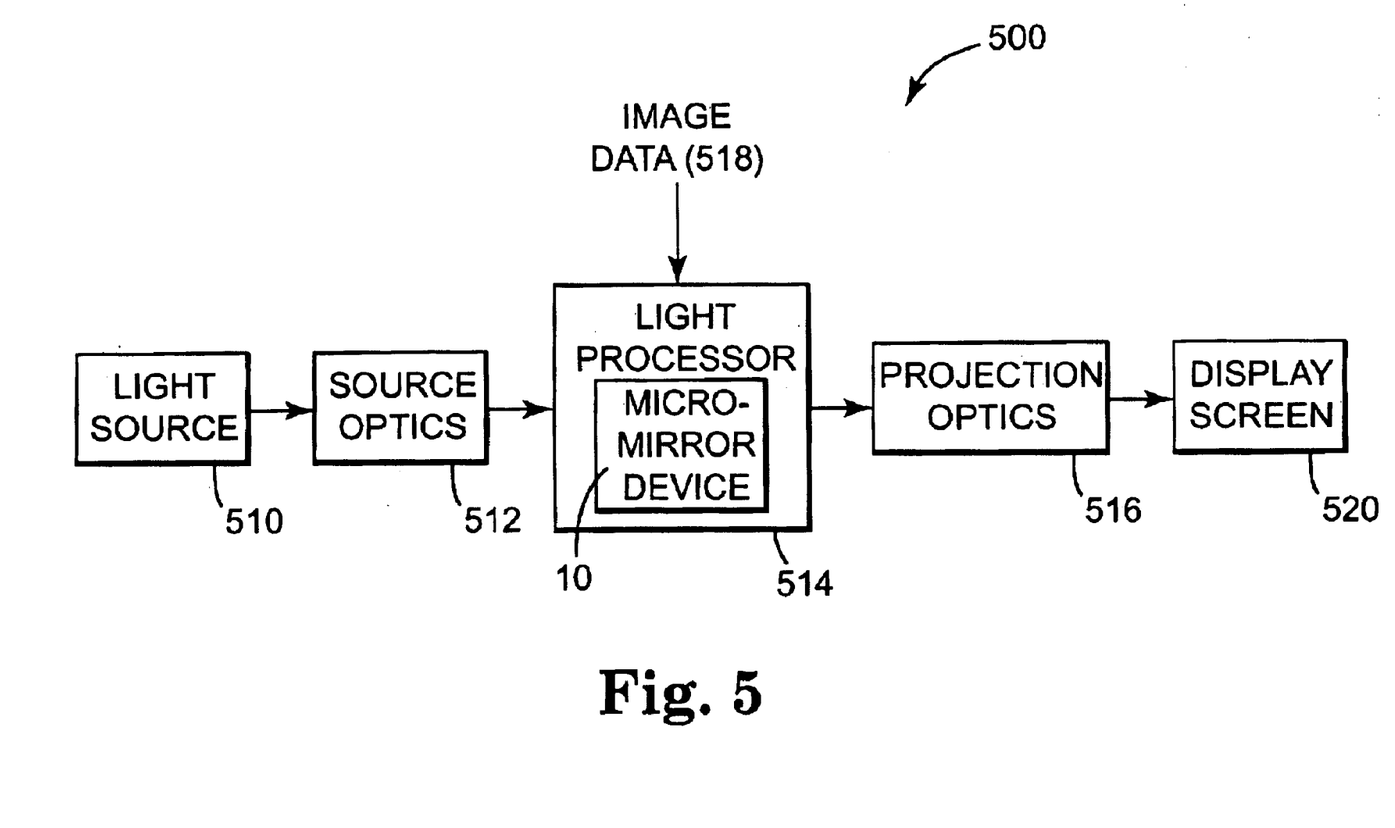
FIG. 5 is a block diagram illustrating one embodiment of a display system including a micro-mirror device according to the present invention.

In one embodiment, as illustrated in FIG. 5, micro-mirror device 10 is incorporated in a display system 500. Display system 500 includes a light source 510, source optics 512, a light processor or controller 514, and projection optics 516. Light processor 514 includes multiple micro-mirror devices 10 arranged in an array such that each micro-mirror device 10 constitutes one cell or pixel of the display.

In one embodiment, light processor 514 receives image data 518 representing an image to be displayed. As such, light processor 514 controls the actuation of micro-mirror devices 10 and the modulation of light received from light source 510 based on image data 518. The modulated light is then projected to a viewer or onto a display screen 520.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method of forming a MEMS device, the method comprising:

providing a substructure including a base material and at least one conductive layer formed on a first side of the base material;

forming a dielectric layer over the at least one conductive layer of the substructure;

forming a protective layer over the dielectric layer;

defining an electrical contact area for the MEMS device on the protective layer; and forming an opening within the electrical contact area through the protective layer and the dielectric layer to the at least one conductive layer of the substructure.

2. The method of claim 1, wherein the substructure includes a complementary metal oxide semi-conductor structure.

3. The method of claim 1, wherein the base material of the substructure includes silicon and the at least one conductive layer of the substructure includes aluminum.

4. The method of claim 1, wherein forming the dielectric layer includes depositing a first dielectric material over the at least one conductive layer of the substructure, and forming a substantially planar surface of the first dielectric material.

5. The method of claim 4, wherein the first dielectric material includes tetraethylorthosilicate.

6. The method of claim 4, wherein forming the protective layer includes depositing a second dielectric material over the substantially planar surface of the first dielectric material.

7. The method of claim 6, wherein the second dielectric material includes silicon carbide.

8. The method of claim 1, wherein defining the electrical contact area includes depositing an etch resistant material on the protective layer and defining a boundary of the electrical contact area with the etch resistant material, and wherein forming the opening within the electrical contact area includes etching within the boundary of the electrical contact area through the protective layer and the dielectric layer to the at least one conductive layer of the substructure.

9. The method of claim 8, wherein the etch resistant material includes titanium nitride.

10. The method of claim 8, further comprising:

defining an actuating area for the MEMS device on the protective layer, including depositing a conductive material on the protective layer and communicating the conductive material with the at least one conductive layer of the substructure through the protective layer and the dielectric layer.

11. The method of claim 10, further comprising:

forming a sacrificial layer over the conductive material and the protective layer; and forming an actuating element within the actuating area over the sacrificial layer, including communicating the actuating element with the conductive material of the actuating area through the sacrificial layer.

12. The method of claim 11, wherein forming the sacrificial layer includes depositing a dielectric material over the conductive material and the protective layer, and forming a substantially planar surface of the dielectric material.

13. The method of claim 12, wherein the dielectric material includes tetraethylorthosilicate.

14. The method of claim 12, wherein forming the actuating element includes depositing a material over the substantially planar surface of the dielectric material.

15. The method of claim 11, further comprising:

forming at least one electrode on the protective layer within the actuating area, wherein the actuating element is adapted to move in response to application of an electrical signal to the at least one electrode.

16. The method of claim 11, further comprising:

forming a mask layer over the actuating element and the sacrificial layer, including defining a mask opening in the mask layer within the electrical contact area, and wherein forming the opening within the electrical contact area includes forming the opening through the mask opening in the mask layer and the sacrificial layer to the boundary of the electrical contact area.

17. The method of claim 16, further comprising:

removing the mask layer;

temporarily filling the opening within the electrical contact area with a protective material; and substantially removing the sacrificial layer between the actuating element and the protective layer, including etching the sacrificial layer.

18. A method of forming a micro-mirror device, the method comprising:

providing a substructure including a base material and at least one conductive layer formed on a first side of the base material;

forming a layer of a dielectric material over the at least one conductive layer of the substructure;

forming a layer of a material resistant to a second etch process within the layer of the dielectric material;

defining an electrical contact area for the micro-mirror device on the material resistant to the second etch process with a material resistant to a first etch process;

forming a reflective element over the dielectric material;

forming an opening in the electrical contact area through the dielectric material and the material resistant to the second etch process with the first etch process, including forming the opening to the at least one conductive layer of the substructure and defining an outline of the opening with the material resistant to the first etch process; and substantially removing the dielectric material between the reflective element and the material resistant to the second etch process with the second etch process.

19. The method of claim 18, wherein forming the layer of the dielectric material and forming the layer of the material resistant to the second etch process includes forming a first portion of the layer of the dielectric material, forming the layer of the material resistant to the second etch process over the first portion, and forming a second portion of the layer of the dielectric material over the layer of the material resistant to the second etch process.

20. The method of claim 18, further comprising:

forming a conductive path on the material resistant to the second etch process, including communicating the conductive path with the reflective element and communicating the conductive path with the at least one conductive layer of the substructure through the material resistant to the second etch process and the dielectric material.

21. The method of claim 18, further comprising:
forming at least one electrode on the material resistant to the second etch process,
wherein the reflective element is adapted to move in response to application of an electrical signal to the at least one electrode.

22. The method of claim 18, wherein forming the opening in the electrical contact area includes forming a mask layer over the reflective element and the dielectric material, and patterning the mask layer to define an exposed portion of the dielectric material in the electrical contact area, and includes etching the exposed portion of the dielectric material with the first etch process.

23. The method of claim 18, wherein substantially removing the dielectric material between the reflective element and the material resistant to the second etch process includes temporarily filling the opening in the electrical contact area with a protective material resistant to the second etch process.

24. The method of claim 18, wherein the substructure includes a complementary metal oxide semi-conductor structure.

25. The method of claim 18, wherein the base material of the substructure includes silicon and the at least one conductive layer of the substructure includes aluminum.

26. The method of claim 18, wherein the dielectric material includes tetraethylorthosilicate.

27. The method of claim 18, wherein the material resistant to the second etch process includes silicon carbide.

28. The method of claim 18, wherein the material resistant to the first etch process includes titanium nitride.

29. The method of claim 18, wherein the first etch process includes a dry etch process.

30. The method of claim 18, wherein the second etch process includes a wet etch process.

31. A MEMS device, comprising:
a substructure including a base material and at least one conductive layer formed on a first side of the base material;
a dielectric layer formed over the at least one conductive layer of the substructure;
a protective layer formed over the dielectric layer;
an actuating element extended over the protective layer; and
an electrical contact area including an opening formed through the protective layer and the dielectric layer to the at least one conductive layer of the substructure.

32. The device of claim 31, further comprising:
a conductive path formed on the protective layer, the conductive path communicated with the actuating element and communicated with the at least one conductive layer of the substructure through the protective layer and the dielectric layer.

33. The device of claim 31, further comprising:
at least one electrode formed on the protective layer,
wherein the actuating element is adapted to move in response to application of an electrical signal to the at least one electrode.

34. The device of claim 31, further comprising:
an etch resistant material provided on the protective layer in the electrical contact area, the etch resistant material defining a boundary of the opening of the electrical contact area and adapted to mask a portion of the protective layer when the opening is formed.

35. The device of claim 34, further comprising:
a sacrificial layer formed over the protective layer,
wherein the actuating element is formed over the sacrificial layer, and the sacrificial layer is adapted to be removed after the actuating element is formed.

36. The device of claim 35, further comprising:
a mask layer formed over the actuating element and the sacrificial layer, the mask layer including a mask opening exposing a portion of the sacrificial layer,
wherein the opening of the electrical contact area is adapted to be formed through the mask opening and the sacrificial layer to the etch resistant material provided on the protective layer, and
wherein the mask layer is adapted to be removed after the opening of the electrical contact area is formed.

37. The device of claim 36, wherein the opening of the electrical contact area is adapted to be formed with a first etch process, and the sacrificial layer is adapted to be removed with a second etch process.

38. The method of claim 37, wherein the first etch process is a dry etch and the second etch process is a wet etch.

39. The device of claim 35, wherein the sacrificial layer includes tetraethylorthosilicate.

40. The device of claim 31, wherein the protective layer includes silicon carbide.

41. The device of claim 31, wherein the dielectric layer includes tetraethylorthosilicate.

42. The device of claim 31, wherein the substructure includes a complementary metal oxide semi-conductor structure.

43. The device of claim 31, wherein the base material of the substructure includes silicon, and the at least one conductive layer of the substructure includes aluminum.

44. The device of claim 31, wherein the MEMS device includes a micro-mirror device, and the actuating element includes a reflective element.

45. A micro-mirror device, comprising:
a substructure including a base material and at least one conductive layer formed on a first side of the base material;
a first dielectric layer formed over the at least one conductive layer of the substructure;
a second dielectric layer formed over the first dielectric layer;
a reflective element extended over the second dielectric layer; and
an electrical contact area including an opening formed through the second dielectric layer and the first dielectric layer to the at least one conductive layer of the substructure.

46. The device of claim 45, further comprising:
a conductive path formed on the second dielectric layer, the conductive path communicated with the reflective element and communicated with the at least one conductive layer of the substructure through the second dielectric layer and the first dielectric layer.

47. The device of claim 45, further comprising:
at least one electrode formed on the second dielectric layer,
wherein the reflective element is adapted to move in response to application of an electrical signal to the at least one electrode.

48. The device of claim 45, further comprising:
a material resistant to a first etch process provided on the second dielectric layer in the electrical contact area,
wherein the opening of the electrical contact area is adapted to be formed with the first etch process and the material resistant to the first etch process is adapted to mask a portion of the second dielectric layer.

49. The device of claim 48, further comprising:
a sacrificial layer formed over the second dielectric layer,
wherein the reflective element is formed over the sacrificial layer, and
wherein the second dielectric layer includes a material resistant to a second etch process and the sacrificial layer is adapted to be removed by the second etch process after the reflective element is formed.

50. The device of claim 49, wherein the first etch process is a dry etch and the second etch process is a wet etch.

51. The device of claim 49, wherein the sacrificial layer includes tetraethylorthosilicate.

52. The device of claim 45, wherein the second dielectric layer includes silicon carbide.

53. The device of claim 45, wherein the first dielectric layer includes tetraethylorthosilicate.

54. The device of claim 45, wherein the substructure includes a complementary metal oxide semi-conductor structure.

55. The device of claim 45, wherein the base material of the substructure includes silicon, and the at least one conductive layer of the substructure includes aluminum.

56. A display device including the micro-mirror device of claim 45.

* * * * *